(12) United States Patent
Navoni

(10) Patent No.: US 6,535,952 B1
(45) Date of Patent: Mar. 18, 2003

(54) METHOD FOR INCREASING THE EQUIVALENT COMPUTATIONAL PRECISION IN AN ANALOG ASSOCIATIVE MEMORY

(75) Inventor: Loris Navoni, Cernusco Sul Naviglio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/544,524

(22) Filed: Apr. 6, 2000

(30) Foreign Application Priority Data

Apr. 9, 1999 (IT) .......................................... MI99A0737

(51) Int. Cl.⁷ .............................................. G06F 12/00
(52) U.S. Cl. ........................... 711/108; 711/1; 711/206; 711/221
(58) Field of Search ............................ 711/108, 1, 206, 711/221

(56) References Cited

U.S. PATENT DOCUMENTS

| | | | |
|---|---|---|---|
| 4,491,932 A | * | 1/1985 | Ruhman et al. ............ 382/131 |
| 5,974,521 A | * | 10/1999 | Akerib ........................ 712/11 |
| 6,269,352 B1 | * | 7/2001 | Fabbrizio et al. ............. 706/15 |
| 6,415,293 B1 | * | 7/2002 | Navoni et al. ................ 365/49 |

OTHER PUBLICATIONS

Lee et al., "Analog Floating–Gate Synapses for General–Purpose VLSI Neural Comptation," IEEE, pp 654–658, Jun. 1991.*
Andreou et al., "Neural Architectures for Smart Memories in Analog VLSI," IEEE, pp 671–676, Aug. 1988.*

* cited by examiner

*Primary Examiner*—Matthew Kim
*Assistant Examiner*—Stephen Elmore
(74) *Attorney, Agent, or Firm*—Lisa K. Jorgenson; Robert Iannucci; Seed IP Law Group PLLC

(57) ABSTRACT

The equivalent computational precision in an associative memory is increased by determining the difference between the bit precision that is required in order to represent a given number in the memory and the bit precision that can be represented in a memory element of the memory, which is dictated by the inherent characteristics of the memory; determining, on the basis of the difference, the number of memory elements of the memory required in order to represent the given number with the required bit precision; and dividing the given number over the number of memory element of the memory, determining a base value to be loaded into the number of memory element and a remainder which indicates a subset of the number of memory element of the memory over which the remainder is to be divided.

20 Claims, 1 Drawing Sheet

METHOD FOR INCREASING THE EQUIVALENT COMPUTATIONAL PRECISION IN AN ANALOG ASSOCIATIVE MEMORY

TECHNICAL FIELD

The present invention relates to a method for increasing the equivalent computational precision in an analog associative memory.

BACKGROUND OF THE INVENTION

It is known that analog techniques can lead to highly efficient computing systems when used for the appropriate applications.

The use of an associative analog memory in which both the stored memory rows and the inputs consist of analog vectors (with a 5-bit equivalent precision) leads to architectures which can be highly efficient both in terms of high density and in terms of low energy consumption.

The operation of an associative memory or content-addressable memory, is roughly the opposite of a random-access memory. When a partial or complete data vector is presented to the associative memory, the memory should return the row address of the internally stored data vector that best "matches" the data vector in input to the associative memory.

An analog associative memory is based on programmable nonlinear capacitors implemented with flash-EEPROM technology. Each device in the memory array can store an analog value with a maximum equivalent precision of 5 bits and, when an analog input is supplied, it can compute the absolute value of the difference between the value stored in the device and the value in input. Analog associative memories have a high capacity for the parallel processing of a large amount of data and the ability to provide inexact recognition, so as to be suitable for pattern-matching processing.

In an analog associative memory, the recognition of a pattern occurs, as mentioned, by performing a comparison of the data by means of differences between voltages stored in the flash devices, at a level of resolution of no more than 5 bits. The inherent physical limitations of the device being considered in fact do not allow one to achieve higher data resolutions.

Accordingly, the drawback of conventional analog associative memories is that their range of utilization is limited to applications which do not require high resolution of the data to be handled. For example, when using an analog associative memory as an image compressor, the 5-bit resolution is barely sufficient to ensure an image of reasonable quality.

SUMMARY OF THE INVENTION

An embodiment of the present invention provides a method for increasing the equivalent computational precision in an analog associative memory which allows one to maintain intact the initial precision of each individual device of the memory.

The method increases the equivalent computational precision in an analog associative memory in which the data in the memory are represented in a different manner, maintaining the computational simplicity characteristics of the associative memory and at the same time increasing the obtainable resolution. The method does not entail physical changes to the memory arc, is highly reliable, and is relatively simple to provide at competitive costs.

The method comprises the steps of:

determining, for an associative memory, the difference between the bit precision that is required in order to represent a given number in said memory and the bit precision that can be represented in said memory, which is dictated by the inherent characteristics of said memory;

determining, on the basis of said difference, the number of devices of said memory required in order to represent said given number with the required bit precision; and dividing said given number over said number of devices of said memory, determining a base value to be loaded into said number of devices and a remainder which indicates a subset of said number of devices of the memory over which said remainder is to be divided.

DESCRIPTION OF THE PREFERRED EMBODIMENTS

Figure 1:
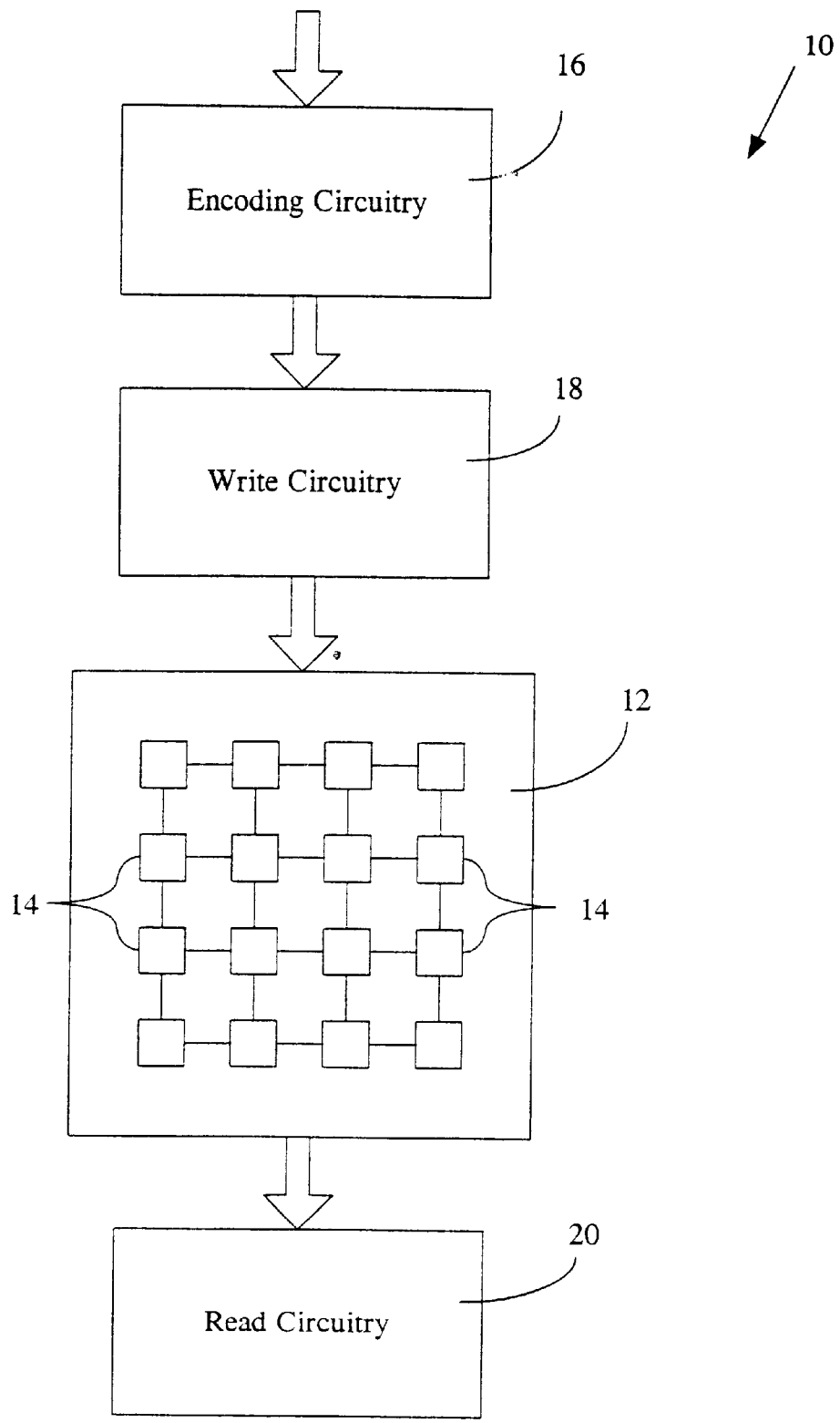
FIG. 1 is a schematic view of an associative memory according to the invention.

Further characteristics and advantages of the present invention will become apparent from the following detailed description of a preferred but not exclusive embodiment of the method according to the invention as follows.

FIG. 1 shows an associative memory 10 having an array 12 of memory elements 14 that are capable of storing K integer values each, where $K=2^\phi$, i.e., have a bit resolution level equal to $\phi$. The associative memory 10 also includes encoding circuitry that receives an input number N, having a bit precision $\eta$. The encoding circuitry 16 encodes the input number as described below and passes the encoded input number to write circuitry 18 for storage in the memory array 12. The associative memory also includes read circuitry 20 for reading the memory array 12. Said memory 10 is used for an analog computation, i.e., for a comparison between stored values and reference values, performed by means of non-discrete components.

In this case, a storage criterion that meets the conditions related to the analog computation, for values with a resolution higher than K, is given by the following method.

Let $\eta$ be the bit precision required;

let $\phi$ be the bit precision that can be represented in one memory element of the memory, on the basis of the technological limitations;

let $d=\eta-\phi$ be the difference between the required precision and the precision that can actually be represented in a memory element.

Then $z=2^d$ is the number of memory elements required to represent a number with the precision $\eta$.

Let N be the number to be represented in the memory and let N' be its representation with the precision $\eta$.

The base value V to be loaded into the z memory elements is given by dividing the number N' by the difference d $$V=N'/d$$

Let R be the remainder of this division: such remainder determines the number of strictly ordered elements of z that will be subjected to AN increment of one unit

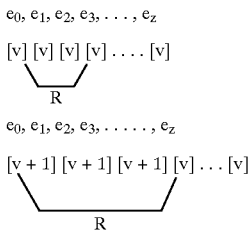

In order to reconstruct the stored value, the following summation is performed:

$$N^{out} = \sum_{1}^{R}(v+1) + \sum_{R+1}^{z}(v)$$

Consider now a particular example: assume a set I of vectors having the dimension s and containing values with 8-bit resolution.

Assume also an analog associative memory capable of containing data, for each computational element, at a maximum resolution of 5 bits, with an array of elements with n columns by m rows.

The associative memory computes, as mentioned, the differences between the input pattern and its own content on the basis of the summation of the individual differences between the individual elements, according to a rule which can be expressed as follows:

$$Vout = \sum_{i=1}^{n} |Vin_i - Vst_i|$$

where Vin and Vst represent the voltage levels that are present respectively on the input line i of the memory and stored in the corresponding memory element i.

It should be observed that a portion (an element or part thereof) of the pattern, coded appropriately, is loaded into the individual elements of the memory line and that the choice of the minimum output voltage Vout is independent of the type of coding (therefore independent of the type of semantics) and, as a first approximation, also independent of the number of elements considered in the line which compose the pattern (a voltage contribution is also provided for logic values 0 in relation to programming mismatching).

The method distributes over a plurality of memory elements the memory the values required to increase the precision up to the required number of bits while maintaining the initial precision for each individual memory element.

The proposed solution stems from the consideration that the data are loaded into the memory elements and are analyzed according to the level of "filling" of the floating gate of the memory element. The difference between the level of the data object in input and the stored one determines the degree of similarity between the values.

The degree of resolution of the stored information depends on the capacity of the circuit to discriminate the levels of voltages determined by the accumulation of charges on the floating gate of each memory element.

If a value, instead of being stored in a single memory element, is divided into a plurality of subparts distributed over the several elements of the memory, also taking into account the remainder, i.e., the part that is not represented owing to the resolution limit, one has a greater discrimination capacity than when the same value is represented in a single memory element, as currently occurs in conventional associative memories.

The proposed method is advantageous for a number of required bits smaller than 8, since from this case the number of necessary memory elements is equal to the number used for single-bit representation.

Consider, therefore, data processing at a resolution of, for example, 7 bits. In this case, let N be the number to be stored with 7-bit resolution.

Calculate the number of memory elements required to represent N with the required resolution:

$$z = 2^{(7-5)} = 4;$$

where z designates the number of devices required to represent the number N.

Calculate the base value to be assigned to the devices (i.e., the 5-bit representation of the number N).

$$V = N/4$$

At this point, calculate the modulus with respect to the representation difference:

$$R = \text{remainder}(N/4)$$

Memory loading is performed by assigning the value V to all the devices, and then increasing by 1 the values of the first R devices.

Reconstruction of the stored value is performed by adding the values of the devices dev:

$$N^{out} = \sum_{1}^{R}(dval+1) + \sum_{R+1}^{dev}(dval)$$

where $N^{out}$ is the value stored in the associative memory.

Consider now a numerical example.

In other words, N=115 (with 7-bit resolution, therefore to be stored on 4 devices of the associative memory)

$$V = 115/4 = 28$$

$$R = \text{remainder }(115/4) = 3$$

The cells of the associative memory are therefore loaded as follows:

[29] [29] [29] [28]

$c_1$ $c_2$ $c_3$ $c_4$

In other words, the first three memory cells $c_1$, $c_2$ and $c_3$ have the value V=28, to which 1 is added. The number of the first memory cells that must be incremented by 1 is determined by-the value of the remainder R (which in this case is in fact equal to 3).

The fourth memory cell $c_4$ instead contains the value 28. During reading, the result is given by:

$$N = c_1 + c_2 + c_3 + c_4 = 29 + 29 + 29 + 28 = 115$$

In practice it has been observed that the method according to the present invention allows to represent in a different way in memory a data item in which the computational characteristics required by the system are maintained but which is interpreted differently with respect to storage with 5-bit resolution.

The method according to the invention allows to maintain 5-bit reading precision, and if one level is lost in one cell the total error resolution is equal to the required resolution.

The use of a plurality of devices in order to increase the precision of the representation entails a lower utilization density of the memory; accordingly, the choice of 7-bit resolution is a good compromise for storage density, maximum possible precision and substantially robustness in error terms.

The method according to the invention can of course be used for N-bit representations, depending on the number of bits that can be stored in a device. In the case of a 5-bit flash device, the method is advantageous for representations up to 7 bits. If the bits ofthe flash device increase, the resolution with which it is possible to represent a value also increases.

The method thus conceived is susceptible of numerous modifications and variations, all of which are within the scope of the inventive concept; all the details may also be replaced with other technically equivalent elements.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for increasing computational precision in an associative memory, comprising the steps of:

determining a difference between a bit precision that is required in order to represent a given number in said memory and a bit precision that can be represented in a memory element of said memory, which is dictated by inherent characteristics of said memory;

determining, on the basis of said difference, the number of memory elements of said memory required in order to represent said given number with the required bit precision; and dividing said given number over said number of memory elements of said memory, determining a base value to be loaded into said number of memory elements and a remainder which indicates a subset of said number of memory elements of the memory over which said remainder is to be divided.

2. The method according to claim 1, wherein said number of memory elements of said memory required in order to represent said given number is obtained by raising two to the power of said difference.

3. The method according to claim 1, wherein said base value to be loaded into each one of said number of memory elements of the memory suitable to represent said given number is determined by a ratio between said number to be represented and said difference.

4. The method according to claim 3, wherein said base value to be assigned to said number of memory elements of the memory corresponds to the representation, according to the intrinsic bit precision of said memory, of the number to be represented in said memory.

5. The method according to claim 1, wherein said remainder divided over said subset of memory elements of the memory is added to said base value.

6. The method according to claim 1, wherein a global representation of said given number is obtained by adding the base values, and any remainder, assigned to said number of memory elements of the memory.

7. The method according to claim 1, wherein each of the memory elements of said associative memory is a memory cell.

8. The method according to claim 7, wherein each memory cell of said associative memory is a cell of the flash-EEPROM type.

9. The method according to claim 1, wherein the representation of said given number in the associative memory consists of the storage of said given number in the memory.

10. The method according to claim 1, wherein a resolution of each memory element of said associative memory is equal to 5 bits.

11. A method of storing an X-bit input number in an associative memory that includes a plurality of memory elements, each memory element being structured to store Y bits of information, the method comprising:

selecting $2^{x-y}$ memory elements for storage of $2^{x-y}$ constituent values;

performing a mathematical operation on the input number to calculate the $2^{x-y}$ constituent values; and storing the respective constituent values in the $2^{x-y}$ memory elements.

12. The method of claim 11 wherein the performing step includes dividing the input number by $2^{x-y}$ to obtain a base number.

13. The method of claim 12 wherein the performing step includes determining whether there is a remainder z resulting from the dividing step, and if so, computing z of the constituent values by incrementing the base number by one.

14. The method of claim 13 wherein the storing step includes using the base number for the $2^{x-y}-z$ constituent values that were not computed by incrementing the base number by one.

15. The method of claim 11 wherein the associative memory is an analog memory and X and Y are each plural numbers.

16. The method if claim 11 wherein each memory element is a memory cell.

17. The method of claim 11 wherein each memory cell of said associative memory is a cell of the flash-EEPROM type.

18. A method of reading an X-bit output number stored in encoded form in an associative memory that includes a plurality of memory elements, each memory element being structured to store Y bits of information, the method comprising:

selecting $2^{x-y}$ memory elements that respectively store $2^{x-y}$ constituent values of the output number;

reading the selected memory elements; and adding together the constituent values to obtain the output number.

19. A memory apparatus for storing an X-bit input number, comprising:

an associative memory matrix that includes a plurality of memory elements, each memory element being structured to store Y bits of information;

encoding circuitry structured to calculate $2^{x-y}$ constituent values by dividing the input number by $2^{x-y}$; and write circuitry for respectively writing the constituent values into selected $2^{x-y}$ memory elements of the memory matrix.

20. The memory apparatus of claim 19 wherein dividing the input number by $2^{x-y}$ results in $2^{x-y}$ equal base values and the encoding circuitry includes means for modifying one or more of the base values based on a remainder resulting from the dividing.

* * * * *